United States Patent [19]

Beale

[11] 3,748,545

[45] July 24, 1973

[54] SEMICONDUCTOR DEVICE WITH INTERNAL CHANNEL STOPPER

[75] Inventor: Julian Robert Anthony Beale, Reigate, England

[73] Assignee: U.S. Philips Corporation

[22] Filed: Aug. 28, 1969

[21] Appl. No.: 853,714

[30] Foreign Application Priority Data

Aug. 30, 1968 Great Britain .................. 41,476/68

[52] U.S. Cl. ............ 317/235 R, 148/175, 148/191, 317/235 E, 317/235 X, 317/235 AG, 317/235 AM, 317/235 G

[51] Int. Cl. ........................................ H01l 19/00

[58] Field of Search .................... 317/235, 22, 22.1, 317/48.1, 48.2, 40.1; 148/174, 175, 191

[56] References Cited

UNITED STATES PATENTS

| | | | |
|---|---|---|---|
| 3,333,166 | 7/1967 | Hochman | 317/235 |
| 3,386,865 | 6/1968 | Doo | 317/235 |
| 3,404,450 | 10/1968 | Karcher | 317/235 |
| 3,440,503 | 4/1969 | Gallagher et al. | 317/235 |
| 3,474,308 | 10/1969 | Kronlage | 317/235 |
| 3,481,801 | 12/1969 | Hugle | 317/235 |

*Primary Examiner*—Jerry D. Craig
*Attorney*—Frank R. Trifari

[57] ABSTRACT

A semiconductor device and method is described employing a one-type epitaxial layer on a one-type substrate, both of high resistivity, containing opposite-type low resistivity buried regions to form islands by outdiffusion for circuit elements. To prevent the occurrence of a parasitic channel along the substrate-epitaxial interface, a one-type highly-doped buried region is provided in the substrate so as to surround the opposite-type buried regions.

4 Claims, 16 Drawing Figures

INVENTOR.
JULIAN R. A. BEALE
BY
AGENT

INVENTOR.

JULIAN R.A. BEALE

BY

AGENT

INVENTOR.

JULIAN R.A. BEALE

BY

[signature]

AGENT

INVENTOR.

JULIAN R.A. BEALE

BY

AGENT

INVENTOR.

JULIAN R.A. BEALE

BY

AGENT

SEMICONDUCTOR DEVICE WITH INTERNAL CHANNEL STOPPER

This invention relates to semiconductor devices comprising a semiconductor body or body part having a substrate portion of one conductivity type, an epitaxial layer of the one conductivity type on the substrate portion, two separated buried regions of the opposite conductivity type each extending at the boundary between the epitaxial layer and the substrate portion and each being associated with separate circuit elements formed in the body or body part. Such devices may consist of semiconductor integrated circuits having a plurality of islands in the epitaxial layer with at least one circuit element present in each island. The invention further relates to methods of manufacturing such semiconductor devices.

In one commonly known form of a semiconductor integrated circuit, a plurality of n-type islands are present in an n-type epitaxial layer situated on a high resistivity p-type substrate. The islands are defined in the epitaxial layer by low resistivity p-type regions extending through the layer from the surface thereof to the p-type substrate. The p-type regions are formed by diffusion and are referred to as isolation walls. The semiconductor circuit elements are present in the n-type islands and are formed by impurity diffusion into the surface portions of the islands through openings in a protective insulating masking layer on the epitaxial layer surface.

Interconnection of the various circuit elements present in the islands is achieved by metal layer parts which form contact with surface portions of the various circuit elements and further extend over the protective insulating layer. Electrical isolation between individual circuit elements in different islands is achieved by reverse-biasing the p-n junctions between the n-type islands and the p-type substrate and isolation walls. When the circuit element is a bipolar transistor, for example an n-p-n planar transistor having diffused emitter and base regions, the original material of the n-type island in the n-type epitaxial layer forms the collector region. Due to the presence of the p-type substrate it is necessary for the collector contact to be situated on the surface of the epitaxial layer. In order to improve the transistor characteristics a so-called 'buried layer' which is an $n^+$-type region may be present at the substrate surface below the part of the island in which the transistor is present. This improves the lateral conductance in the collector region. Additionally an $n^+$-type wall may extend through the collector region from the collector contact on the surface to the $n^+$-type buried layer.

FIGS. 1 to 3 of the accompanying diagrammatic drawings illustrate some of the manufacturing steps involved in the formation of a conventional semiconductor integrated circuit.

The figures show in cross-section part of the semiconductor body of the circuit including two n-p-n transistors. FIG. 1 shows an n-type epitaxial layer on a $p^-$-type substrate with two $n^+$-type buried layers between the substrate and the epitaxial layer, these buried layers having been formed by diffusion of a donor impurity element into limited surface portions of the $p^-$-type substrate prior to the deposition of the n-type epitaxial layer thereon. FIG. 2 shows the semiconductor body after a subsequent stage of the manufacture in which $p^+$-type isolation walls have been formed extending through the epitaxial layer to the substrate and thus dividing the epitaxial layer into a plurality of n-type islands each of which has an associated $n^+$-type buried layer. FIG. 3 shows the body after the emitter and base regions of two transistors have been formed in two adjacent n-type islands in the epitaxial layer. Each transistor has an n-type collector region with an $n^+$-type buried layer extending below the emitter and base regions. The collector contact is situated on a surface portion of the epitaxial layer at which a local $n^+$-type diffused region has been formed. FIG. 4 shows a modification of the integrated circuit shown in FIG. 3, the collector region comprising an $n^+$-type diffused wall extending from the surface of the epitaxial layer to the $n^+$-type buried layer and providing a low collector series resistance when the collector contact is situated on a surface portion of the $n^+$-type diffused wall. It will be appreciated that on the surface of the epitaxial layer a protective insulating layer is present with openings therein which contain ohmic contacts with the various regions of the transistors but for the sake of clarity these are not shown in the Figures. Electrical isolation between the two transistors is achieved in operation by reverse-biasing the p-n junctions between the n-type collector regions and the p-type substrate and isolation walls. It is found that for some circuit applications this form of so-called p-n junction isolation is not adequate as the capacitance per unit area of the isolating p-n junctions is unduly high.

Recently there have been proposed various integrated circuit structures in which by suitable use of epitaxial layer and buried layer techniques the manufacturing steps are simplified and the electrical characteristics of the circuits are improved. The basis of these structures is that the substrate and the epitaxial layer are of the same conductivity type and generally both of high resistivity material. The use of high resistivity material for both the substrate and epitaxial layer can yield a low capacitance per unit area of isolating p-n junctions. However when using such high resistivity material of one conductivity type for the epitaxial layer and substrate, problems arise in the processing when it is desired to provide two or more separated buried regions of the opposite conductivity type at the boundary between the epitaxial layer and substrate. Thus for example, where a high resistivity p-type substrate is used and prior to depositing thereon a high resistivity p-type epitaxial layer two or more separated highly doped $n^+$-type layers are formed at the substrate surface which subsequent to the epitaxial deposition become so-called buried layers, the problem arises that during the initial epitaxial deposition of the p-type layer at the elevated temperature of the substrate the donor impurity may diffuse out from the diffused $n^+$-type layers into the ambient gas used for the deposition and subsequently be re-deposited over the whole surface in a greater concentration than the acceptor impurities deposited from the ambient gas. Thus a parasitic n-type epitaxial channel region may be formed at the substrate surface extending between the buried $n^+$-type regions. For an integrated circuit structure, for example in which the $n^+$-type buried layers form part of the collector regions of separate transistors the parasitic n-type channel will lead to the electrical shorting of the collector regions. It may be possible to prevent the occurrence of the parasitic n-type channel by choosing a higher impurity concentration for the deposited epitaxial layer but this will lead to further problems in that the electrical characteristics of the circuit may be effected adversely and the further manufacturing steps may be more complex.

According to the invention a semiconductor device comprises a semiconductor body or body part having a substrate portion of one conductivity type, an epitaxial layer of the one conductivity type on the substrate portion, two separated buried regions of the opposite conductivity type each extending at the boundary between the substrate portion and the epitaxial layer and being associated with separate circuit elements formed in the body or body part, and an isolating buried region of the one conductivity type situated at the boundary between the substrate portion and the epitaxial layer, the isolating region having a lower resistivity than the substrate portion and the epitaxial layer and serving to prevent the occurrence of a parasitic channel of the opposite conductivity type between the separated buried regions of the opposite conductivity type.

This device structure has various advantages, particularly in respect of the manufacturing steps involved having regard to the aforesaid problems which occur when depositing a high resistivity epitaxial layer of the one conductivity type on a high resitivity substrate portion of the one conductivity type containing two surface regions of the opposite conductivity type. If in the manufacture the isolating region if provided prior to the epitaxial deposition of the layer and the conditions of epitaxial deposition are such as to cause any impurity diffusion from the buried regions into the gas phase and subsequent re-deposition over the entire surface, the deposited layer will be wholly of the one conductivity type because under said conditions some diffusion of the impurity element characteristic of the one conductivity type will occur from the lower resistivity isolating region into the overlying part of the epitaxially deposited layer. Thus the occurrence of a parasitic channel of the opposite conductivity type between the separated buried regions of the opposite conductivity type is prevented.

In one preferred form of a device in accordance with the invention the isolating buried region is a locally diffused region and at the boundary between the substrate portion and the epitaxial layer the isolating buried region of the one conductivity type totally encloses at least one of the two buried regions of the opposite conductivity type. Such a diffused isolating buried region may be in the form of a grid with the two buried regions of the opposite conductivity type situated within individual areas within the grid. In certain circumstances, particularly if the doping concentration in the isolating region is not appreciably greater than the doping concentration in the substrate portion, for example only 50 times the doping concentration in the substrate portion, the diffused isolating region may be situated closely adjacent or even abutting the buried regions of the opposite conductivity type. This situation of the isolating region may be desirable in an integrated circuit where a large density of circuit elements for a given area is desired and by said situation the addition of the isolating region will not impose any severe restricting effect on said density.

In another form of a device in accordance with the invention the isolating buried region is present in a lower resistivity surface layer of the substrate portion. This surface layer may be an epitaxial layer or a diffused layer. When it is a diffused layer it may be formed in the manufacture of the device either prior or subsequent to forming the separated regions of the opposite conductivity type at the surface of the substrate portion.

In a semiconductor device in accordance with the invention, for example a semiconductor integrated circuit, the buried regions of the opposite conductivity type may be associated with islands of the opposite conductivity type present in the epitaxial layer of the one conductivity type. The islands contain the circuit elements and the buried regions are associated with the circuit elements, for example the buried regions may form parts of the collector regions of bipolar transistors. The islands of the opposite conductivity type may be formed by various means. In one preferred form of a device in accordance with the invention the major parts of the islands of the opposite conductivity type have been formed by diffusion of a conductivity type determining impurity element characteristic of the opposite conductivity type into the epitaxial layer from highly doped separated buried regions of the opposite conducvtivity type extending at the surface of the substrate portion.

In such a device in which the islands have been determined by diffusion from the buried regions various advantages arise (a) in respect of the electrical characteristics of the device so obtained and (b) in respect of the manufacturing steps involved. Thus when the device is a semiconductor integrated circuit the capacitance per unit area of the isolating p-n junctions may be made low by suitable choice of the resistivity of the substrate portion and the epitaxial layer. If the substrate portion and the epitaxial layer thereon of the one conductivity type are both of high resistivity material of the one conductivity type the depletion layers associated with the isolating p-n junctions can spread far into this material of the one conductivity type and yield a low capacitance per unit area. As the islands of the one conductivity type are determined by diffusion from the buried layer it is possible to have an epitaxial layer of the one conductivity type which has a higher resistivity than is normally used in integrated circuit manufacture. Furthermore in the manufacture of such an integrated circuit the necessity of providing diffused walls between the epitaxial layer surface and substrate does not arise because isolation walls in this circuit are formed by the remaining portions of the one conductivity type of the epitaxial layer into which the impurity element of the opposite conductivity type in the buried layer has not been diffused.

The buried regions of the opposite conductivity type may consist of diffused layers formed in parts of the surface of the substrate portion prior to the deposition thereon of the epitaxial layer. Alternatively the buried regions of the opposite conductivity type may consist of epitaxial layer parts of the opposite conductivity type formed on parts of the surface of the substrate portion prior to the epitaxial deposition of the layer of the one conductivity type.

The islands of the opposite conductivity type in the epitaxial layer may be determined substantially entirely by the diffusion of the element characteristic of the opposite conductivity type into the epitaxial layer from the buried regions, the diffused regions forming the islands and extending completely through the thickness of the epitaxial layer from the substrate portion to the surface of the epitaxial layer remote from the substrate portion. Alternatively the islands of the opposite conductivity type in the epitaxial layer may be determined partly by the diffusion of the element characteristic of the opposite conductivity type into the epitaxial layer from the buried regions, the diffused regions of the opposite conductivity type formed extending only partly through the thickness of the epitaxial layer from the substrate portion towards the surface of the epitaxial layer remote from the substrate portion, the islands in the epitaxial layer each being further defined by peripheral wall portions of the opposite conductivity type which extend in the epitaxial layer from the surface thereof to the diffused regions of the opposite conductivity type.

As previously mentioned a semiconductor circuit element present in an island may be a bipolar transistor. Said transistor may comprise a collector region of the opposite conductivity type in which the concentration of the impurity element characteristic of the opposite conductivity type is determined by the element present in and diffused from the buried region, a base region of the one conductivity type formed by introduction of a conductivity type determining impurity element characteristic of the one conductivity type into the epitaxial layer from a surface portion of the island therein, and an emitter region of the opposite conductivity type formed by introduction of a conductivity type determining impurity element characteristic of the opposite conductivity type into the epitaxial layer from a surface portion of the island therein. In this transistor at a surface portion of the epitaxial layer where the collector region extends to said surface there may be a low resistivity diffused region of the opposite conductivity type on which the collector contact is situated. The low resistivity diffused region of the opposite conductivity type may extend through the epitaxial layer to the buried region of the opposite conductivity type.

In a semiconductor device in accordance with the invention in which the epitaxial layer comprises islands of the opposite conductivity type, at the surface of the epitaxial layer there may be a lower resistivity region of the one conductivity type to prevent the occurrence of a continuous parasitic surface channel of the opposite conductivity type between the islands of the opposite conductivity type in the epitaxial layer.

In another preferred form of a semiconductor device in accordance with the invention the buried regions of the opposite conductivity type form part of collector regions of bipolar transistors, each transistor collector region further comprising a peripheral wall portion of the opposite conductivity type extending through the epitaxial layer between the buried region and the surface of the epitaxial layer remote from the substrate portion, the base region of the transistor being present in an island of the one conductivity type in the epitaxial layer situated within the peripheral wall portion of the collector region, the emitter region of the transistor consisting of a region of the opposite conductivity type extending in said island from the epitaxial layer surface. The base region may comprise a diffused concentration of an impurity element characteristic of the one conductivity type.

In another form of a semiconductor device in accordance with the invention in which the epitaxial layer comprises islands of the opposite conductivity type, in at least one of the islands there is an insulated gate field effect transistor comprising low resistivity source and drain regions of the one conductivity type extending in the epitaxial layer from the surface thereof and defining a current carrying surface region in the epitaxial layer, a gate electrode being situated in spaced relation to the current carrying surface region and separated therefrom by insulating material. In the epitaxial layer beyond the islands there may be at least one insulated gate field effect transistor of opposite polarity to the insulated gate field effect transistor present in the one island. This device may be a semiconductor integrated circuit comprising complementary pair insulated gate field effect transistors, that is, transistors of one polarity are present in the island or islands of the opposite conductivity type in the epitaxial layer and transistors of the opposite polarity are present in remaining portion or portions of the epitaxial layer of the conductivity type.

The semiconductor device may be of silicon and a protective insulating material on the epitaxial layer surface may be of silicon oxide, silicon nitride or layer structures employing both such materials.

According to a further aspect of the invention in a method of manufacturing a semiconductor device which comprises forming at the surface of a semiconductor substrate portion of one conductivity type two separated regions of the opposite conductivity type, depositing an epitaxial layer of the one conductivity type on the surface of the substrate portion to bury the regions of the opposite conductivity type and the provision of semiconductor circuit elements with which the buried regions of the opposite conductivity type are associated, prior to depositing the epitaxial layer an isolating region of the one conductivity type and having a lower resistivity than the substrate and epitaxial layer is formed at the surface of the substrate portion to prevent the occurrence of a parasitic channel of the opposite conductivity type between the separated buried regions of the opposite conductivity type. In one form of this method the isolating region is formed by the local diffusion of an impurity element characteristic of the one conductivity type into an area of the surface of the substrate portion which surrounds the area occupied or to be occupied by at least one of the regions of the opposite conductivity type.

In another form of the method the isolating region is formed by providing a lower resistivity layer of the one conductivity type at the surface of the substrate portion. This lower resistivity surface layer may be formed by diffusion or may be an epitaxial surface layer.

Embodiments of the invention will now be described, by way of example, with reference to FIGS. 5 to 16 of the accompanying diagrammatic drawings, in which.

Figure 1:
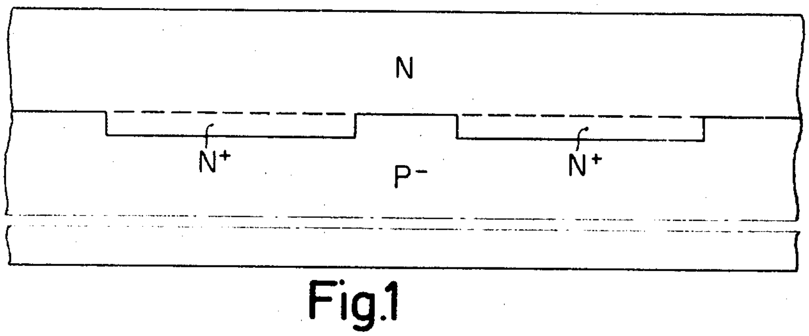
Figure 2:
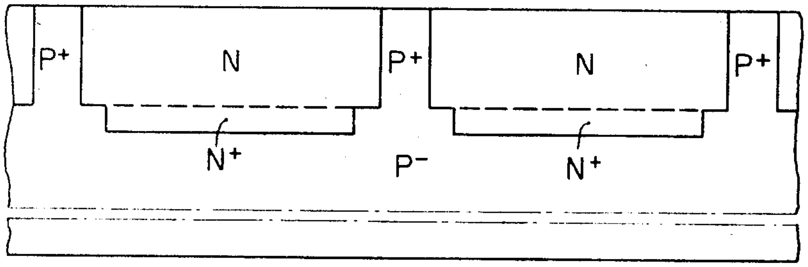
Figure 3:
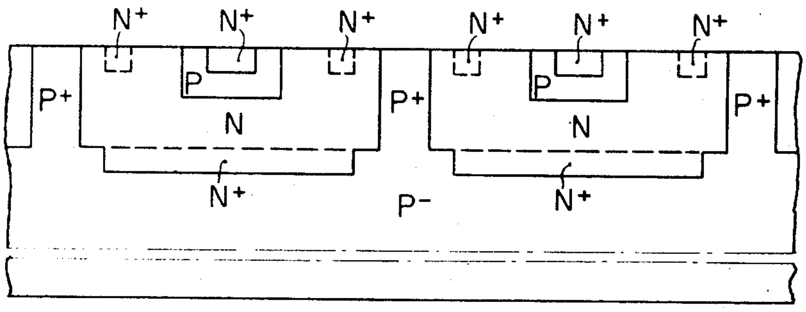
Figure 4:
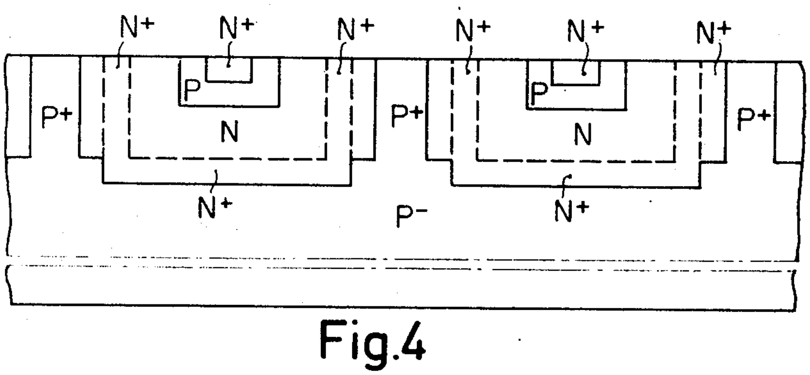
Figure 5:
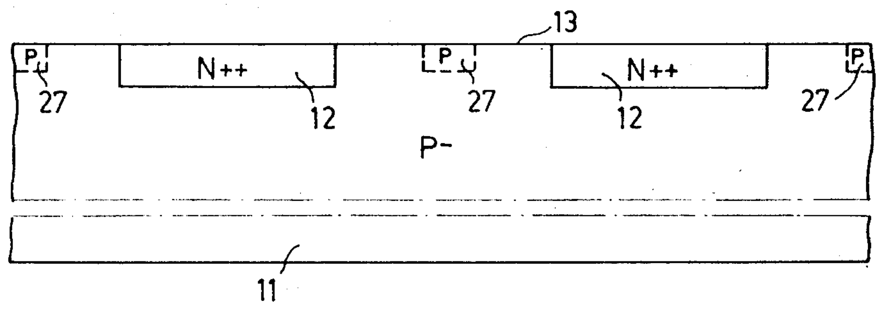
FIGS. 5 to 7 are cross-sections of the semiconductor body of a semiconductor integrated circuit comprising two bipolar transistors, at various stages in the manufacture of the circuit.
Figure 6:
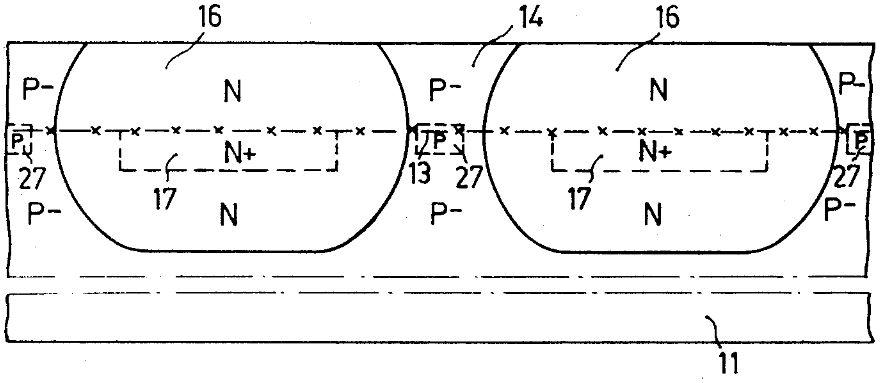
Figure 7:
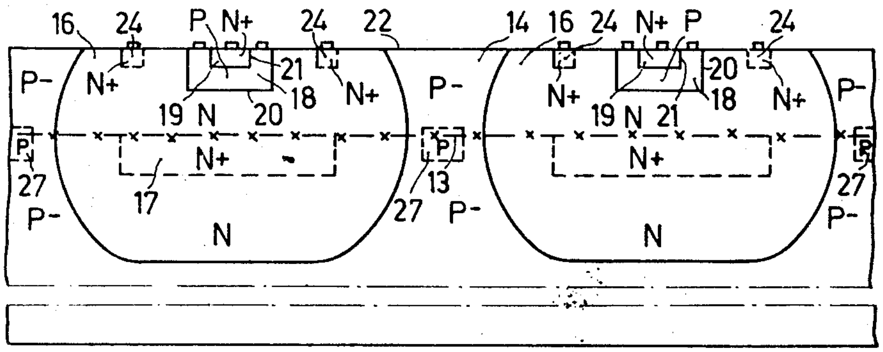

Referring first to FIGS. 5 to 7, the starting material is a $p^-$-type silicon substrate 11 of approximately 200 $\mu$ thickness and 40 ohm-cm resistivity. Using normal oxide masking and diffusion techniques $n^{++}$-type regions 12 and a p-type grid 27 are formed in the surface of the substrate 11. Phosphorus is used as the donor impurity which is diffused into the substrate 11 to form the layers 12 and boron is used as the acceptor impurity which is diffused into the substrate 11 to form the grid 27 which has a lower resistivity than the substrate 11. For the sake of clarity the oxide masking layer on the substrate surface 13 is not shown in FIG. 5. The oxide masking layer is removed after the phosphorus and boron diffusion steps and a $p^-$-type silicon epitaxial layer 14 of 5$\mu$ thickness and 5 ohm-cm resistivity is epitaxially deposited on the substrate surface 13. The layer 14 thus buries the $n^{++}$-type regions 12 and the p-type grid 27. If the conditions of epitaxial deposition are such as to cause the phosphorus in the regions 12 to diffuse into the gas phase and bere-deposited on the surface the presence of the p-type grid 27 which surrounds each of the regions 12 prevents the formation of a continuous n-type skin on the surface because some of the boron concentration in the p-type grid 27 will diffuse into the overlying parts of the deposited layer and provide an acceptor concentration in excess of the re-deposited donor concentration. Thus the deposited layer is wholly of $p^-$-type material and the occurrence of a parasitic n-type channel between the $n^{++}$-type buried regions is prevented. During and subsequent to the deposition of the layer 14 the phosphorus in the buried regions 12 is diffused further into the substrate 11 and into parts of the overlying epitaxial layer 14. The results in the structure shown in FIG. 6, the original substrate surface 13 being shown by a chain-dot line. The phosphorus has been diffused to completely convert to n-type conductivity parts of the epitaxial layer above the buried regions 12. Thus this diffused phosphorus concentration determines n-type islands 16 in the $p^-$-type epitaxial layer 14. These islands further extend into the $p^-$-type substrate 11 due to the phosphorus diffusion therein and each includes an $n^+$-type buried region 17 in which the phosphorus concentration is less than in the originally formed $n^{++}$-type regions 12. For this reason the regions 12 and 17 are referred to as $n^{++}$-type and $n^+$-type respectively and the regions 17 in FIG. 6 are shown in dotted outline.

Subsequent to forming the n-type islands 16 in the $p^-$-type epitaxial layer 14, circuit elements are formed in the islands 16. FIG. 7 shows an n-p-n bipolar transistor formed in each of the two islands 14 shown in the section. The transistors each comprise a diffused p-type base region 18 and a diffused $n^+$-type emitter region 19. The base region 18 is surrounded within the island 16 by the n-type collector region and the base region 18 in turn surrounds the emitter region 19. The collector/base junction 20 and the emitter/base junction 21 both terminate at the surface 22 of the epitaxial layer below a silicon oxide layer which for the sake of clarity is not shown in the Figure. Ohmic contacts to surface portions of the emitter and base regions are formed by metal layer parts extending in openings in the silicon oxide layer. Ohmic contact to the collector region is formed by a further metal layer part in an opening in the silicon oxide layer above an $n^+$-type diffused collector contact region 24.

Electrical isolation of the transistors in the integrated circuit is achieved in operation by reverse biasing the p-n junctions between the collector regions in the n-type islands 16 and the $p^-$-type substrate 11 and remaining $p^-$-type portion of the epitaxial layer 14. The $p^-$-type substrate 11 and portion of the layer 14 have a high resistivty and so the capacitance per unit area of the isolating junctions is low because the depletion layers associated with these junctions can spread far into the $p^-$-type material. This leads to improved characteristics of the circuit. Furthermore the presence of the $n^+$-type buried regions 17 in the collector regions yields a low collector series resistance in the lateral direction. The collector series resistance in the transverse direction across the epitaxial layer is low because the donor concentration in the collector regions increases progressively from the collector/base junctions 20 to the $n^+$-type buried layers 17.

Figure 8:
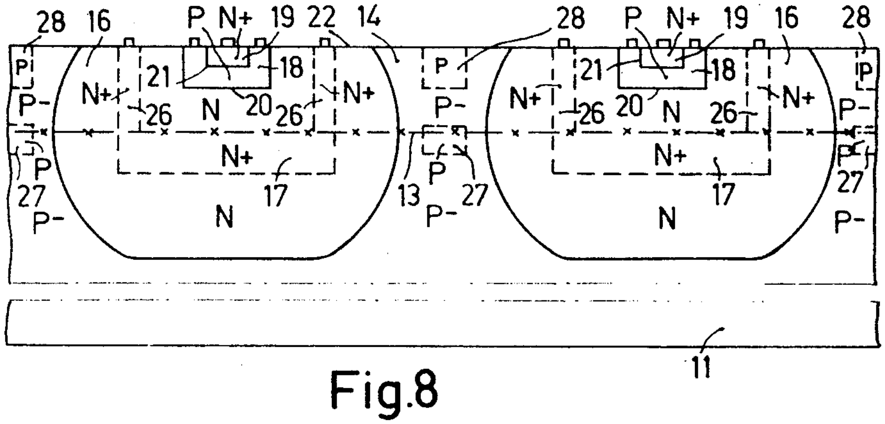
FIG. 8 is a cross-section of the semiconductor body of a semiconductor integrated circuit which is a modification of the circuit shown in FIG. 7.

FIG. 8 shows a modification of the integrated circuit shown in FIG. 7, corresponding regions being indicated with the same reference numerals. In this circuit the collector contact is situated on an $n^+$-type diffused wall 26 in the collector region, the wall 26 extending through the epitaxial layer from the surface 22 to the burried region 17. This further enhances the obtainment of a low collector series resistance in the transverse direction. Additionally in the surface 22 of the epitaxial layer 14 a p-type grid 28 is present to prevent the occurrance of continuous parasitic n-type surface inversion layers between the adjacent islands 16.

Figure 9:
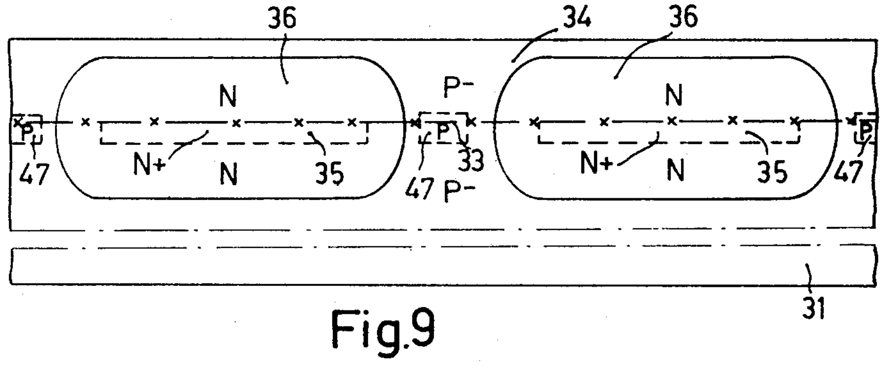
FIGS. 9 to 11 are cross-sections of the semiconductor body of another semiconductor integrated circuit comprising two bipolar transistors at various stages in the manufacture of the circuit.
Figure 10:
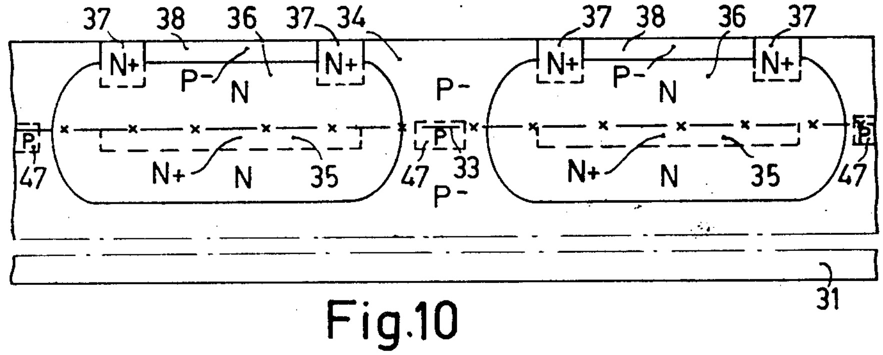
Figure 11:
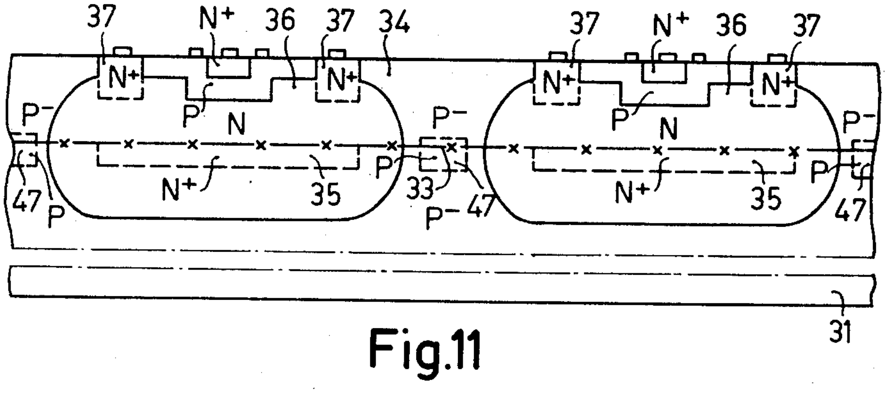

Referring now to FIGS. 9 to 11, the starting material in the manufacture of the semiconductor integrated circuit shown in FIG. 11 is a $p^-$-type silicon substrate 31 of 200$\mu$ thickness and 40 ohm-cm resistivity. In a similar manner as used in the previously described embodiment $n^{++}$-type regions and a p-type grid 47 are formed in the surface 33 of the substrate 31. Phosphorus is used as the donor impurity which is diffused into the substrate to form the $n^{++}$-type buried regions and boron is used as the impurity for forming the grid 47. Subsequently a $p^-$-type silicon epitaxial layer 34 of 7$\mu$ thickness and 5 ohm-cm resistivity is epitaxially deposited on the substrate surface 33. The $p^-$-type layer 34 thus buries the diffused $n^{++}$-type layers and the p-type grid 47. During and subsequent to the deposition of the $p^-$-type layer 34 the phosphorus in the buried $n^{++}$-type layers is diffused further into the substrate 31 and into parts of the overlying epitaxial layer 34. FIG. 9 shows the semiconductor body after this phosphorus diffusion, the phosphorus concentration in the buried layer having been reduced and these layers being now designated as $n^+$ -type layers 35. The phosphorus diffusion is insufficient to convert the whole thickness of the overlying part of the epitaxial layer 34 to n-type conductivity and thus isolated n-type parts 36 are present in the epitaxial layer 34. As in the previous embodiment the lower resistivity p-type grid 47 prevents the occurrence of a continuous parasitic n-type channel between the adjacent $n^+$-type regions which channel could be formed by re-deposition on the entire surface of phosphorus diffused into the gas phase from the $n^{++}$-type buried regions.

Subsequently, diffused $n^+$-type peripheral walls 37 are formed between the surface of the epitaxial layer and the diffused n-type parts 36 in the layer 34. The walls 37 together with the n-type parts 36 thus define islands in the epitaxial layer 34 which are mainly n-type and comprise isolated $p^-$-type surface portions 38. FIG. 10 shows the body after forming the walls 37. In these islands n-p-n transistors are formed by conventional diffusion techniques using a silicon oxide masking layer on the surface of the epitaxial layer. The acceptor diffusion to form the base region is effected so that the collector/base junction has a part situated within the n-type part 36 formed by the phosphorus diffusion from the buried layer. The adjacent parts of the collector/base junction are parts of the p-n junctions previously formed between the $p^-$-type surface region 38 and the n-type part 36 and wall 37. The collector contact is situated on a surface portion of the $n^+$-type wall 37. Similar advantages arise in respect of the low capacitance per unit area of the isolating p-n junctions between the n-type collector regions and the $p^-$-type material of the substrate 31 and the layer 34 as in the previously described embodiments. Also due to the presence of the $n^+$ -type buried layers 35 the collector series resistance of the transistors is low.

Figure 12:
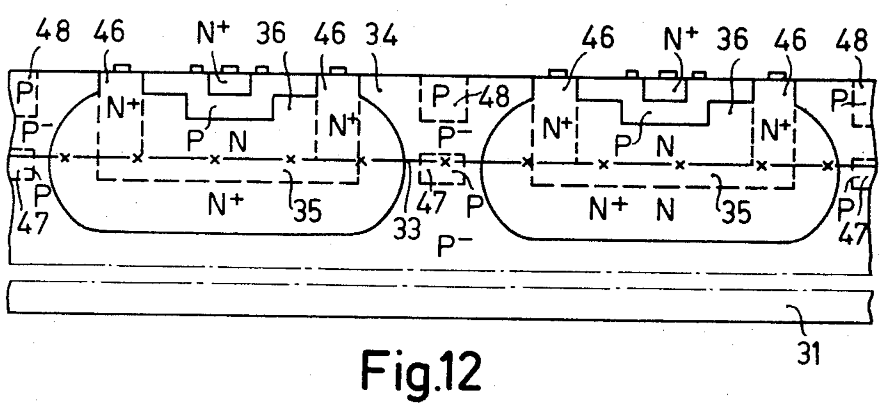
FIG. 12 is a cross-section of the semiconductor body of a semiconductor integrated circuit shown in FIG. 11.

FIG. 12 shows a modification of the integrated circuit shown in FIG. 11, corresponding regions being indicated with the same reference numerals. In this circuit the collector contact is situated on an $n^+$-type diffused wall 46 in the collector region, the wall 46 extending through the epitaxial layer from the surface to the buried layer 35. This further enhances the obtainment of a low collector series resistance in the transverse direction. Additionally in the surface of the epitaxial layer 34 a p-type grid 48 is present to prevent the occurrence of continuous parasitic n-type surface inversion layers between the adjacent islands 36 in the layer 34.

Many further modifications of the transistors present in the islands in the epitaxial layer are possible. For example, the impurity concentration in the collector region may be profiled Application No. 41475/68 (PHB 31901) bearing the same date as by providing a donor concentration in the $n^{++}$-type buried region which is greater at the part of said region which is to be located immediately below the emitter region than at the adjacent parts of the buried region. ALternatively two different donor elements having different rates of diffusion may be used in the buried region, the element with the higher diffusivity being provided locally in the part of the buried region which is to be located immediately below the emitter region.

Figure 13:
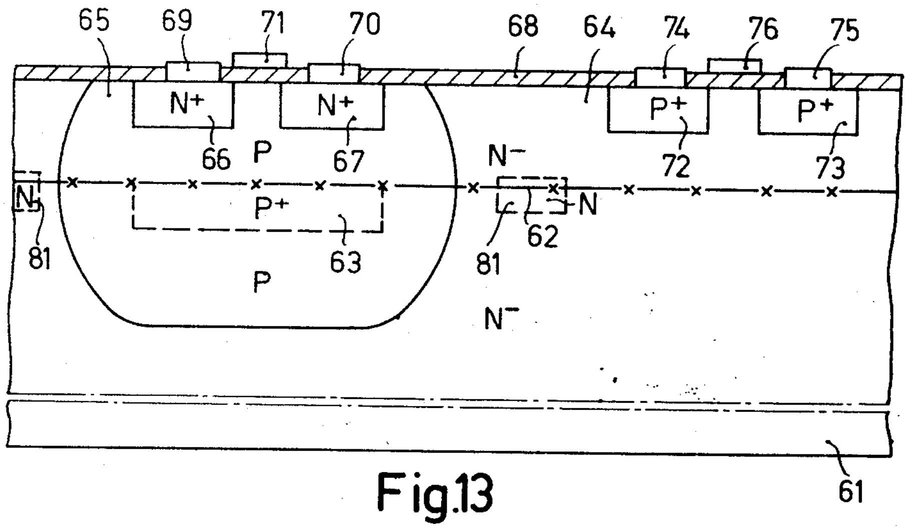
FIGS. 13 and 14 are cross-sections of the semiconductor bodies of two further semiconductor integrated circuits, each comprising insulated gate field effect transistors of opposite polarities.

The semiconductor integrated circuit shown in FIG. 13 comprises two enhancement mode silicon insulated gate field effect transistors of opposite polarities, that is an n-channel field effect transistor and a p-channel field effect transistor. The semiconductor body comprises an $n^-$-type silicon substrate 61. In the surface 62 of the substrate 61 there is a $p^+$-type diffused buried region 63 containing boron as the diffused acceptor element and an n-type diffused region 81 surrounding the region 63. On the substrate surface 63 there is an $n^-$-type silicon epitaxial layer 64. A p-type island 65 is present in the layer 64, the p-type conductivity of the island being due to a concentration of boron diffused into the layer 64 from the buried layer 63. The boron also has been diffused from the buried layer 63 further into the substrate 61 as shown in the Figure. The n-typed diffused region 81 serves to prevent the occurrence of a continuous parasitic p-type channel between the p-type island 65 and a further p-type island (not shown) containing a further circuit element. This channel could occur if the conditions of epitaxial deposition are such that boron in the buried region diffuses into the gas phase and is re-deposited on the entire surface. The n-type region 81 provides a diffusion source of phosphorus for diffusion into the overlying parts of the epitaxial layer so that in these parts the donor concentration exceeds any re-deposited acceptor concentration. In the island 65 there is an n-channel field effect transistor comprising $n^+$-type diffused source and drain regions 66 and 67. On the surface of the epitaxial layer 64 there is a silicon oxide layer 68 with openings therein containing metal layer ohmic contacts 69 and 70 to the $n^+$-type source and drain regions 66 and 67 respectively. On the silicon oxide layer 68 between the source and drain regions there is a metal layer gate electrode 71.

In the epitaxial layer 64 there is a complementary p-channel field effect transistor comprising $p^+$-type diffused source and drain regions 72 and 73, ohmic contact metal layers 74 and 75 to the source and drain regions 72 and 73 respectively, and a gate electrode 76. This circuit, in addition to having the same advantages in respect of the improved separation and electrical isolation properties between circuit elements as occurs in the bipolar transistor circuits previously described, also has advantages in respect of the simplicity of manufacture provided by the particular structure.

Figure 14:
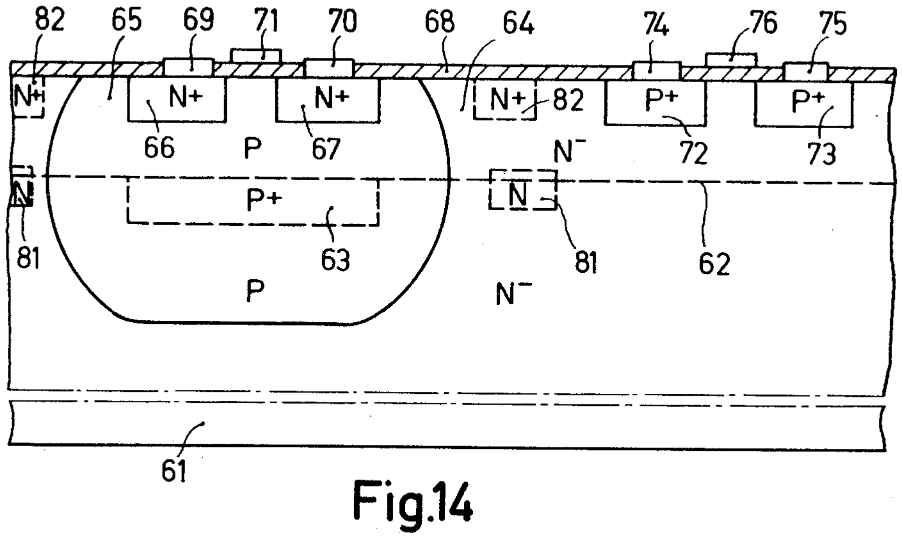

FIG. 14 shows a semiconductor integrated circuit comprising an n-channel field effect transistor and a p-channel field effect transistor which is a modification of the circuit shown in FIG. 13, corresponding regions being indicated with the same reference numerals. An $n^+$-type region 82 is present in the surface of the epitaxial layer 64 to prevent the occurrence of a continuous parasitic p-type surface layer between the island 64 and the $p^+$-type source and drain regions 72 and 73. The $n^+$-type region 82 may extend below a metal layer interconnection part on the insulating layer and thus prevent the occurrence of a continuous induced surface inversion layer below said metal layer part.

Figure 15:
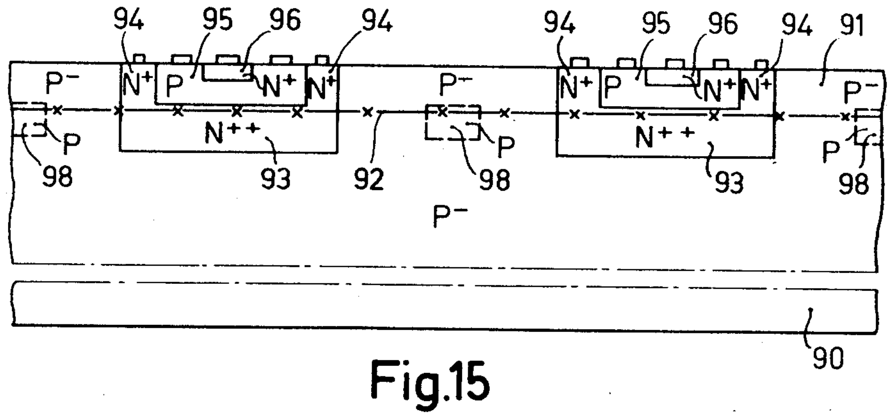
FIGS. 15 and 16 are cross-sections of the semiconductor bodies of two further semiconductor integrated circuits each comprising two bipolar transistors.

The semiconductor device shown in FIG. 15 is a semiconductor integrated circuit comprising two bipolar transistors. In this circuit isolation between the transistors is by so-called 'collector diffusion isolation'. The device comprises a $p^-$-type substrate 90 having a thin, in this case of 3 microns thickness, $p^-$-type epitaxial layer 91 on the substrate 90. The boundary between the substrate and epitaxial layer is shown by the chain line 92. Each n-p-n transistor comprises a collector region formed by an $n^{++}$-type buried region 93 and a peripheral $n^+$-type diffused wall 94 which extends through the layer 91 between the surface of the epitaxial layer and the buried region 93. The transistor base regions are constituted by the $p^-$-type parts 95 of the original epitaxial layer enclosed by the $n^+$-type walls 94. The transistor emitter regions are constituted by diffused $n^+$-type regions 96. Isolation is achieved electrically by reverse biasing the p-n junctions between the collector regions 93, 94 and the $p^-$-type substrate 90 and epitaxial layer 91. It is evident that the capacitance per unit area of the isolating p-n junctions will be low because the depletion layers associated with these junctions can spread far into the high resistivity $p^-$-type substrate and epitaxial layer.

The collector/base junctions of the transistors where they extend substantially parallel to the surface of the epitaxial layer are shown in the Figure lying in the epitaxial layer and displaced from the boundary between the substrate and epitaxial layer. This is because during the epitaxial deposition the donor impurity in the buried regions 93 diffuses into the overlying parts of the deposited layer.

In accordance with the invention there is a p-type isolating region 98 situated at the boundary between the substrate and epitaxial layer and serving to prevent the occurrence of a continuous parasitic channel between the buried regions 93 forming part of the transistor collector regions. This p-type isolating region 98 has a lower resistivity than the substrate 90 and epitaxial layer 91 and extends a small distance into the epitaxial layer 91. It has been formed by diffusion of boron into the substrate surface prior to the deposition of the layer 91. During the epitaxial deposition some of the previously diffused boron has diffused into the overlying parts of the layer 91. This counteracts the possible formation of a continuous parasitic n-type channel along the substrate surface which could be formed if the conditions of epitaxial deposition are such that donor impurity diffuses from the highly doped regions 93 into the gas phase and is re-deposited over the whole surface of the substrate. The region 98 extends at the boundary between the substrate 90 and epitaxial layer 91 in the form of a grid surrounding each of the buried regions 93.

It is mentioned that the circuit having the form shown in FIG. 15 in addition to providing a low capacitance of the isolating junctions and relative simplicity of manufacturing operations, also permits a high packing density of circuit elements for a given area of the semiconductor body. The addition in accordance with the invention of the isolating region 98 need not adversely influence this packing density, particularly if the doping concentration in the region 98 is not more than 50 times the value of the donor concentration in the substrate because in that case the p-type region 98 may be situated immediately adjacent one or both of the buried regions 93.

Figure 16:
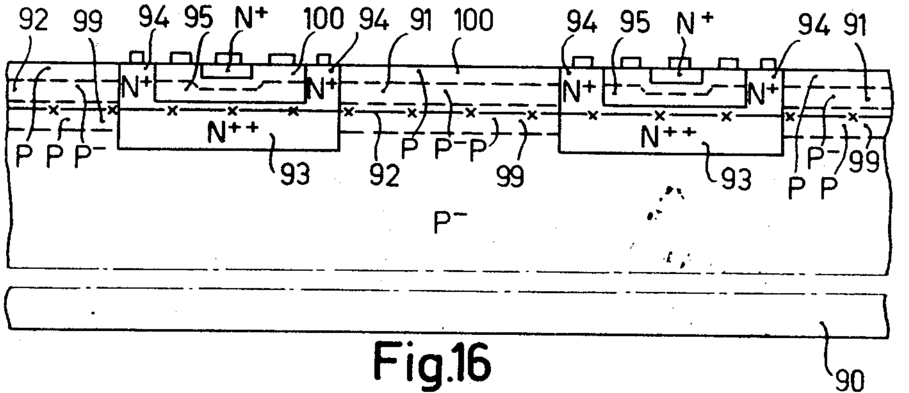

FIG. 16 shows a modification of the circuit shown in FIG. 15, corresponding regions being indicated with the same reference numerals. In this circuit the p-type isolating region provided to prevent the occurrence of a continuous parasitic n-type channel between the buried regions 93 consists of a p-type surface layer 99 of the substrate 90 formed by diffusion of boron into the substrate surface prior to applying the epitaxial layer 91. This configuration permits a very high packing density of circuit elements. However, the acceptor concentration in the diffused layer 99 must be chosen to be not too high, for example not more than 50 times the acceptor concentration in the substrate and epitaxial layer, as to adversely influence the transistor characteristics. Additionally the circuit shown in FIG. 16 comprises a diffused p-type region 100 at the surface of the epitaxial layer 91. The diffused region provides a graded impurity concentration in the base regions of the transistors and leads to a circuit having better transistor characteristics than the circuit shown in FIG. 15.

What we claim is:

1. A semconductor device comprising a semiconductor body of relatively high resistivity and of one type conductivity, an epitaxial layer of relatively high resistivity and of one type conductivity on the body forming a semiconductor-semiconductor interface, at least two separated highly doped buried layers of relatively low resistivity and of the opposite type conductivity located at the semiconductor-semiconductor interface and extending into the substrate and into the epitaxial layer, a first circuit element including an active zone built into the epitaxial layer over one of the opposite type buried layers, a second circuit element including an active zone built into the epitaxial layer over the other of the opposite type buried layers, regions of the one type epitaxial layer separating and isolating the circuit elements, and an isolating region of relatively low resistivity and of the one conductivity type located at the semiconductor-semiconductor interface and extending into the substrate and into the epitaxial layer completely between the two opposite type buried layers to prevent the occurrence of a parasitic channel of the opposite conductivity type between the latter along the interface, all of said buried layers having a maximum dopant concentration in the body in the vicinity of the semiconductor-semiconductor interface and a decreasing dopant concentration in the direction of the epitaxial layer surface.

2. A device as set forth in claim 1 wherein the dopants in the opposite type buried layers extend substantially through the epitaxial layer forming two separated islands of opposite type conductivity, the circuit elements being built into the separated islands.

3. A device as set forth in claim 1 wherein the isolating region is spaced from the opposite type buried layers but completely surrounds each of them.

4. A device as set forth in claim 1 wherein the isolating region is in the form of a grid and the two opposite type buried layers are situated within individual areas within the grid.

* * * * *